US006504175B1

(12) United States Patent
Mei et al.

(10) Patent No.: US 6,504,175 B1
(45) Date of Patent: Jan. 7, 2003

(54) HYBRID POLYCRYSTALLINE AND AMORPHOUS SILICON STRUCTURES ON A SHARED SUBSTRATE

(75) Inventors: Ping Mei, Palo Alto; Rene A. Lujan, Sunnyvale, both of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/067,943

(22) Filed: Apr. 28, 1998

(51) Int. Cl.$^7$ .................. H01L 29/76; H01L 31/036
(52) U.S. Cl. .................. 257/66; 257/67; 257/70; 257/72; 257/75; 257/57; 257/61; 257/65; 438/149; 438/166
(58) Field of Search .................. 257/66, 67, 70, 257/72, 75, 57, 61, 65, 381; 438/149, 166

(56) References Cited

U.S. PATENT DOCUMENTS

| | | | |
|---|---|---|---|
| 4,407,010 A | 9/1983 | Baji et al. | 358/213 |
| 4,954,895 A | 9/1990 | Akimoto et al. | 358/213.11 |
| 5,017,989 A | 5/1991 | Street et al. | 357/30 |
| 5,243,202 A | 9/1993 | Mori et al. | 257/59 |
| 5,262,649 A | 11/1993 | Antonuk et al. | 250/370.09 |
| 5,366,926 A | 11/1994 | Mei et al. | 437/173 |
| 5,539,461 A | 7/1996 | Andoh et al. | 348/308 |
| 5,733,804 A | * 3/1998 | Hack et al. | 438/158 |
| 5,871,826 A | * 2/1999 | Mei et al. | 427/596 |
| 5,903,014 A | * 5/1999 | Ino et al. | 257/66 |

OTHER PUBLICATIONS

Aoyama et al., Inverse Staggered Polycrystalline and Amorphous Silicon Double Structure Thin Film Transistors, Appl. Phys. Lett., vol. 66, No. 22, May 29, 1995, p. 3007–3009.*

L.E. Antonuk, J. Boudry, C.W. Kim, M. Longo, E.J. Morton, J. Yorkston, Signal, Noise, and Readout Considerations in the Development of Amorphous Silicon Photodiode Arrays for Radiotherapy and Diagnostic X–ray Imaging, *SPIE*, vol. 1443, Medical Imaging V: Image Physics, 1991, p. 108–119.

T. Aoyama, K. Ogawa, Y. Mochizuki. N. Konishi, Inverse Staggered Polycrystalline and Amorphous Silicon Double Structure Thin Film Transistors, *Appl. Phys. Lett.*, vol. 66, No. 22, May 29, 1995, p. 3007–3009.

S.S. He, D.J. Stephens, G. Lucovsky, Improved Electrical Performance of a–Si:H Thin Film Transistors, TFTs with n+ uc–Si Contact, and Silicon Oxide and Nitride Dual–Layer Dielectrics, *Materials Research Society Symp. Proc.*, vol. 297, 1993, p. 871–876.

S. Kawai, T. Kodama, Y. Nasu, S. Yanagisawa, K. Asama, A Self–Alignment Processed a:Si:H TFT Matrix Circuit for LCD Panels, *Proceedings of the SID*, vol. 251/1, 1984, p. 21–24.

T. Serikawa, S. Shirai, A. Okamoto, S. Suyama, Low–Temperature Fabrication of High–Mobility Poly–Si TFT's for Large–Area LCD's, *IEEE Transactions on Electron Devices*, vol. 36, No. 9, Sep. 1989, p. 1929–1933.

(List continued on next page.)

Primary Examiner—Carl Whitehead, Jr.
Assistant Examiner—Matthew E. Warren

(57) ABSTRACT

Amorphous and polycrystalline silicon (hybrid) devices are formed close to one another employing laser crystallization and back side lithography processes. A mask (e.g., TiW) is used to protect the amorphous silicon device during laser crystallization. A patterned nitride layer is used to protect the amorphous silicon device during rehydrogenation of the polycrystalline silicon. An absorption film (e.g., amorphous silicon) is used to compensate for the different transparencies of amorphous and polycrystalline silicon during the back side lithography. Device spacing of between 2 and 50 micrometers may be obtained, while using materials and process steps otherwise compatible with existing hybrid device formation processes.

17 Claims, 5 Drawing Sheets

OTHER PUBLICATIONS

K. Shimizu, O. Sugiura, M. Matsumura, On–Chip Bottom–Gate Polysilicon and Amorphous Silicon Thin–Film Transistors Using Excimer Laser Annealing, *Japanese Journal of Applied Physics*, vol. 29, No. 10, Oct. 1990, p. L1775–L1777.

K. Shimizu, H. Hosoya, O. Sugiura, High–Mobility Bottom–Gate Thin–Film Transistors with Laser–Crystallized and Hydrogen–Radical–Annealed Polysilicon Films, *Japanese Journal of Applied Physics*, Part 1, vol. 30, No. 12B, 1991, p. 3704–3709.

R.A. Street, S. Nelson, Amorphous Silicon Sensor Arrays for Radiation Imaging, *Materials Research Society Symp. Proc.*, vol. 192, 1990, p. 441–452.

T. Tanaka, H. Asuma, K. Ogawa, Y. Shinagawa, K. Ono, N. Konishi, An LCD Addressed by a–Si:H TFTs with Peripheral poly–Si TFT Circuits, *IEEE*, 1993, p. 389–392.

J. Yorkston, L.E. Antonuk, E.J. Morton, J. Boudry, W. Huang, C.W. Kim, M.J. Longo, R.A. Street, The Dynamic Response of Hydrogenated Amorphous Silicon Imaging Pixels, *Materials Research Society Symp. Proc.*, vol. 219, 1991, p. 173–178.

* cited by examiner

HYBRID POLYCRYSTALLINE AND AMORPHOUS SILICON STRUCTURES ON A SHARED SUBSTRATE

BACKGROUND

The present invention relates generally to the field of semiconductor device manufacturing, and more particularly to a method of fabricating circuits comprised of both polycrystalline and amorphous silicon devices in close proximity to one another.

Amorphous silicon (a-Si) is a material commonly employed for example in largearea electronic devices such image sensors, displays, etc. Active matrix liquid crystal displays (AMLCDs), for instance, may be comprised of 7 million or more pixels formed on a sheet of glass 25 cm by 20 cm or larger, where each pixel includes one or more transistors formed in part of a-Si. A two dimensional (2-d) imager with a similar pixel count may be 46.5 cm by 36 cm, for example. In addition to the pixel transistor(s), AMLCDs, image sensors, and the like often require related circuitry such as drivers, decoders, etc. It is desirable to integrate this related circuitry onto the glass substrate to reduce size, cost, etc. Most commonly, this related circuitry is located at the periphery of the pixel array on the substrate.

It is well recognized that devices fabricated from a-Si are relatively slow-due to the poor carrier mobility in a-Si. While adequately fast to serve as pixel thin film transistors (TFTs), a-Si transistors are considered too slow to provide adequate performance of the related circuitry. One technique employed to address this shortfall of a-Si devices has been to use polycrystalline silicon (poly-Si) devices for the related circuitry. Poly-Si TFTs, for example, provide a 20 to 100-fold improvement in carrier mobility over a-Si TFTs, thus proportionally increasing device speed. Poly-Si devices may be formed on the same substrate as a-Si devices, the processing steps being compatible for the two different materials.

However, it is also well recognized that a-Si devices provide some advantages over poly-Si devices. Poly-Si TFTs have a higher leakage current, for example more than two orders of magnitude, than similar a-Si devices, which is undesirable for applications such as 2-d imaging arrays. Thus, it is preferable to exploit the desirable to properties of both a-Si and poly-Si devices in a single array. A structure comprised of both a-Si and poly-Si devices on a shared substrate is referred to herein as a hybrid structure.

One method disclosed in the art for forming poly-Si TFTs on a shared substrate with a-Si TFTs is referred to as laser crystallization. There are numerous embodiments of laser crystallization. According to one such embodiment, a $SiO_2$ gate insulation film is grown on a highly doped single crystal silicon substrate which serves as a gate electrode. An a-Si film is next deposited by chemical vapor deposition (CVD) onto the $SiO_2$ film. The a-Si film is then crystallized by excimer laser annealing, and hydrogenated by further annealing in the presence of hydrogen. Aluminum patterned over the top of this structure provides the electrical contacts. A method of this type is taught by Shimizu et al. in "On-Chip Bottom-Gate Polysilicon and Amorphous Silicon Thin-Film Transistors Using Excimer Laser Annealing," Japanese J. of Appl. Phys., vol. 29, no. 10 pp. 1775 et seq. (October 1990). A similar method taught by U.S. Pat. No. 5,366,926, which is incorporated herein by reference, employs a pulsed laser to crystallize a-Si material to form a poly-Si channel for a TFT.

Known techniques for laser crystallization have several disadvantages. For example, it has been commonly assumed that poly-Si devices would be formed on the substrate periphery, thus relatively far away from a-Si devices. In such case, limited or no masking is required. And if a mask is needed, a shadow mask protecting the a-Si device from the laser during the crystallization process is adequate. However, recent pixel designs for high performance arrays include poly-Si and a-Si devices in very close proximity to one another, for example on the order of 5 μm or less from edge to adjacent edge. This is not possible from current process, which are designed for separations between poly-Si and a-Si devices on the order of 3 mm. New techniques and structures are required to provide this close spacing between devices.

SUMMARY

The present invention is a novel process and structure which overcomes the disadvantages referred to above. In particular, we have discovered a novel process for the formation of a device, such as a TFT, having a poly-Si conductive region formed from what was originally an a-Si layer. Furthermore, the process and related structure is ideally suited to the formation of a-Si and poly-Si devices on a shared substrate at a spacing of between 2 and 50 μm. Minimal additional processing is required over existing techniques, and all additional steps and materials are compatible with existing manufacturing processes.

An exemplary process according to the present invention begins with the formation of metal gate lines on a substrate such as glass. A dielectric layer is deposited over the gate metal and substrate, and an a-Si layer is deposited over the dielectric layer. An oxide insulation layer is deposited over the a-Si layer. Finally, an a-Si layer, referred to herein as a compensation or absorption layer, is applied over the oxide layer. The thickness of this a-Si compensation layer is selected to provide to improved absorption of the ultra violet (UV) radiation used in a back-side lithography process employed to form a conductive region, such as a channel, of the device being fabricated. The back-side lithography is then performed, and a doped or intrinsic silicon layer is applied over the structure. If the silicon is intrinsic, doping is then performed to obtain the desired structure. Gaps and contact metal are then formed to complete the device.

In addition, should it be desired to form the poly-Si device in close proximity to the a-Si device, the following additional steps may be employed. First, a nitride layer such as silicon nitride is applied over the region in which the device which shall remain a-Si is to be formed. A layer of titanium tungsten (TiW) alloy is then also formed over the region in which the device which shall remain a-Si is to be formed. This TiW layer, together with the nitride layer, serves as an optical mask to protect the region in which the device which shall remain a-Si is to be formed during laser crystallization. In substantial part, it is the effectiveness of this mask, and the ability to define its location photolithographically that allows for the formation of poly-Si and a-Si devices at a spacing as small as between 2 and 50 μm.

Following the laser crystallization, the TiW layer is removed. The structure is then rehydrogenated to compensate for the dehydrogenation during the laser crystallization. The nitride layer over the region which is to become the a-Si device serves to protect the a-Si layer from the hydrogenation process. Processing then continues as previously described.

Thus, the present invention and its various embodiments provide numerous advantages including, but not limited to significant reduction in inter-device spacing, simple integration into existing processes, etc., as described in further detail herein.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described, such as flow rates, temperatures, layer thicknesses, etc. These recited ranges are to be treated as examples only, and are not intended to limit the scope of the claims hereof. In addition, a number of materials are identified as suitable for various facets of the embodiments, such as for substrates, dielectric and insulation layers, metalization, etc. These recited materials are also to be treated as exemplary, and are not intended to limit the scope of the claims hereof.

As a matter of terminology, reference herein to a-Si devices include devices in which at least the conductive portion thereof is formed substantially of a-Si. A TFT in which the channel region is formed substantially of a-Si is one example of an a-Si device. Other examples include a thin film capacitor, varactor, resistor, etc. in which at least one conductive region of such device is a-Si. Likewise, reference herein to poly-Si devices include devices in which at least the conductive portion thereof is formed substantially of poly-Si. A TFT in which the channel region is formed substantially of poly-Si is one example of a poly-Si device. Furthermore, device as used herein includes but is not limited to transistors, thin film capacitors, varactors, resistors, and other devices. Finally, use of the term conductive, such as a conductive layer or conductive material as used herein includes semiconductors, but may in certain applications include additional materials such as metals, and the like.

Figure 1:
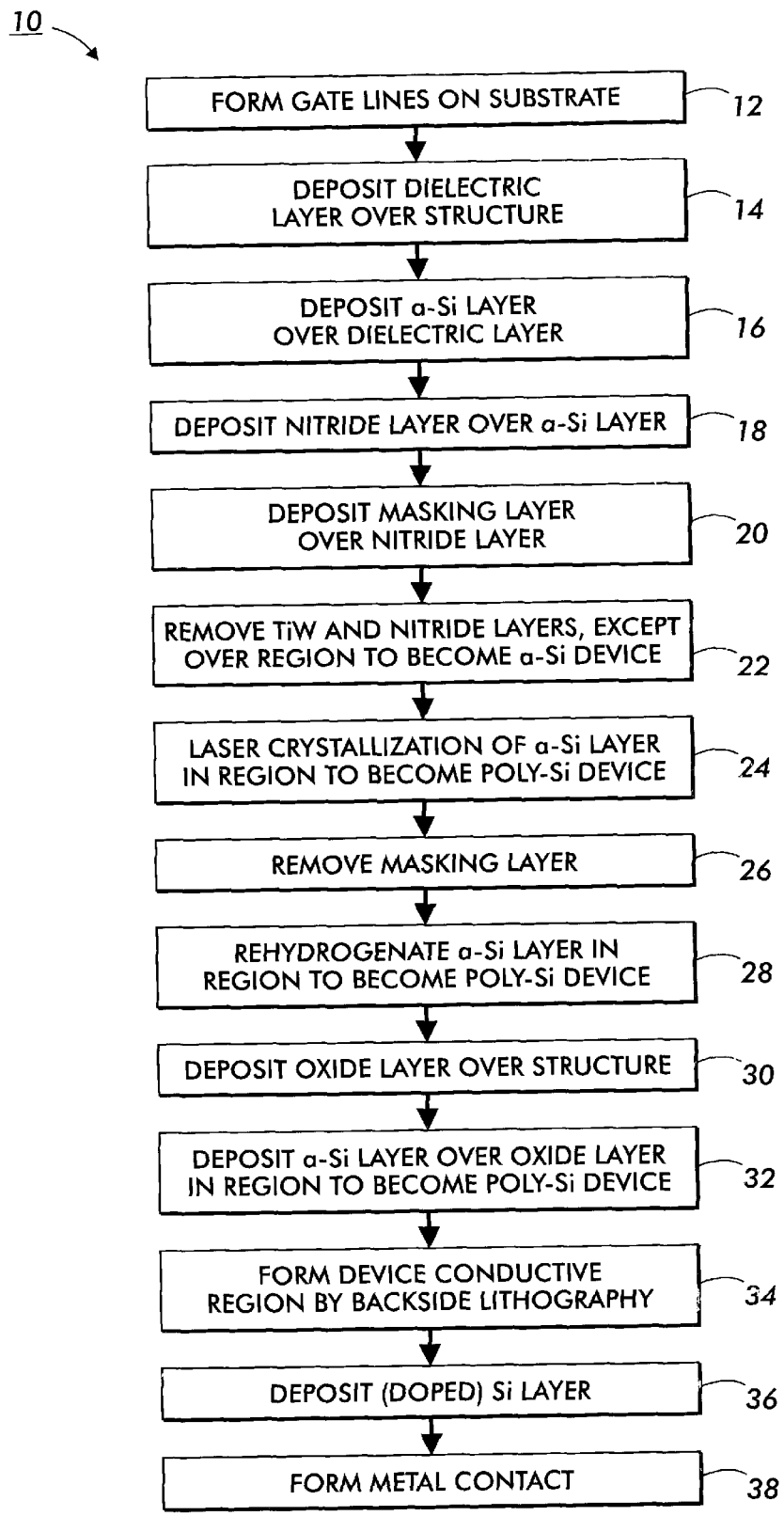
FIG. 1 is a flow diagram illustrating the principle steps in the fabrication of closely spaced a-Si and poly-Si TFTs on a shared substrate.
Figure 2:
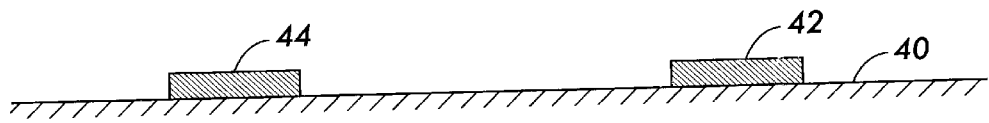
FIG. 2 is a cross-sectional view of two devices being formed on a shared substrate at an initial stage in the process of forming same.

With reference to FIG. 1, a flow diagram is shown, illustrating the principle steps of a process 10 for forming two closely spaced TFTs on a shared substrate according to one embodiment of the present invention. Various of the steps illustrated in FIG. 1 correspond to the state of a structure at various steps in the process of making same illustrated in FIGS. 2 through 10. Accordingly, cross-reference will be made between FIG. 1 and FIGS. 2 through 10 where appropriate.

Process 10 begins at step 12 (FIG. 1) by forming conductive regions, or gate lines 42 and 44 (FIG. 2), of a conductive metal such as CrMo or other suitable material, on a cleaned and appropriately prepared substrate 40. Substrate 40 may be a material such as Corning 7059 or similar material which is transparent to ultra violet radiation of the type employed by subsequently described back side lithography, depending on the particular application. A dielectric layer 46 is then deposited at step 14 over the structure, covering gate lines 42 and 44. Dielectric layer 46 may be a single layer of material such as SiN, or be comprised of multiple sublayers, for example SiN and $SiO_2$ as taught by copending U.S. patent application Ser. No. 08/096,313, incorporated by reference herein. In the later case, the SiN sublayer 48 is deposited by plasma enhanced chemical vapor deposition (PECVD) at about 350° C. over gate lines 42, 44 and substrate 40. The $SiO_2$ sublayer 50 is likewise deposited by PECVD at about 350° C. over SiN layer 48. Alternatively, layer 46 may be an insulating layer other than a dielectric where appropriate.

At step 16, a layer 52 of semiconductor material, such as hydrogenated amorphous silicon (a-Si:H), is deposited over dielectric layer 46. In the case of a-Si:H, layer 52 is formed by PECVD at about 275° C. It is important to note, however, that other materials may be substituted for silicon, depending on the application of the resulting device. For example, gallium arsenide (GaAs), silicon germanium (SiGe), silicon carbide (SiC), pure germanium, etc. may be deposited in an amorphous state, and locally crystallized in situ to produce one or more regions of polycrystalline material. Selection criteria and deposition techniques for other semiconductor materials is known in the art, and will not be discussed further herein.

At step 18, a dielectric layer 54 is deposited over a-Si:H layer 52. The material from which layer 54 is formed is preferably a nitride such as SiN to provide a low leakage current device.

Figure 3:
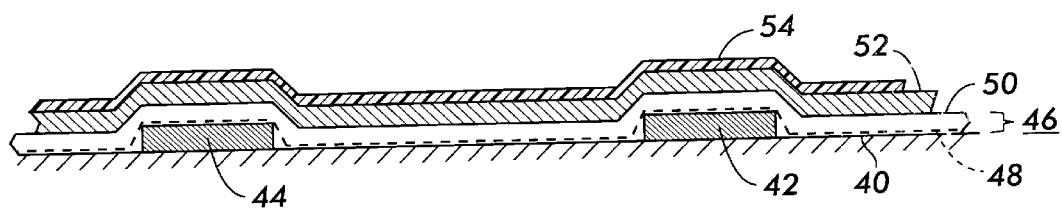
FIG. 3 is a cross-sectional view of two devices being formed on a shared substrate at an intermediate stage in the process of forming same.

At step 20, a masking layer 56 is deposited over the dielectric layer 54. The role of this masking layer will be to shield the region of layer 52 which will become the channel of the a-Si device from laser light during the laser crystallization process. This material must be deposited under conditions consistent with the integrity of the structure (temperature, materials, etc.). Also, layer 56 will be patterned as described further below, so it must be of a material which may be selectively etched during processing. Finally, layer 56 must shield regions below it from the radiation used to crystallize a portion of layer 52. We have found that an alloy of titanium and tungsten (TiW) serves this purpose well, although there may be many other materials or combination which are able to function at least adequately as a masking layer, such as Cr or Al. We have found, however, that layer 56 works best in conjunction with layer 54 to protect regions of layer 52. Thus, for example, it is advantageous to employ TiW of layer 56 with SiN of layer 54, or equivalently Al as layer 56 with SiN of layer 54, etc. Accordingly, in the case where layer 56 is TiW, it may be deposited by sputtering, for example at room temperature, using D.C. magnetron sputtering, or the like. We have found that a 1000 Å thick TiW layer provides the desired functions of layer 56. The resulting structure is essentially as shown in FIG. 3.

It will assist the reader at this point to divide the structure being formed into three regions. First is region 58 in which the a-Si device will be formed. Second is region 60 in which the poly-Si device will be formed. And third is region 60 outside of the first and second regions.

Figure 4:
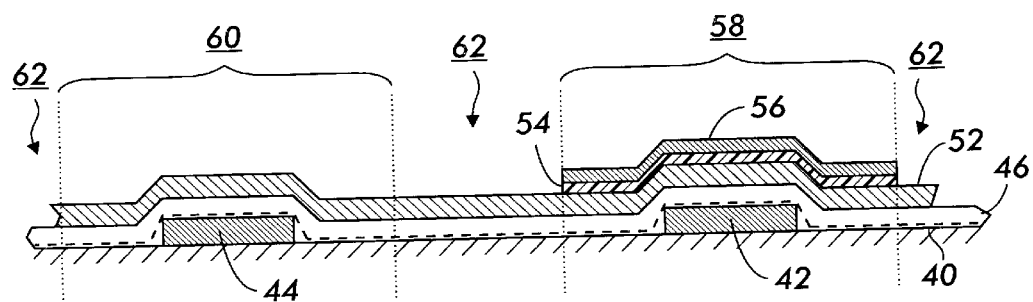
FIG. 4 is a cross-sectional view of two devices being formed on a shared substrate at another intermediate stage in the process of forming same.

At step 22, the dielectric layer 54 and the-masking layer 56 are removed from all but the first region. This is accomplished by depositing a photoresist layer (not shown) over layer 56, and exposing and developing same as well known in the art. Etching in $H_2O_2$ removes the desired portions of TiW layer 56 and stops at the SiN layer 54. Desired portions of the SiN layer 54 are then removed with a buffered HF etch. However, since buffered HF does not etch a-Si layer 52, it remains unaffected by the etching of layers 54 and 56. The resulting structure at this point in the process is as shown in FIG. 4.

Figure 5:
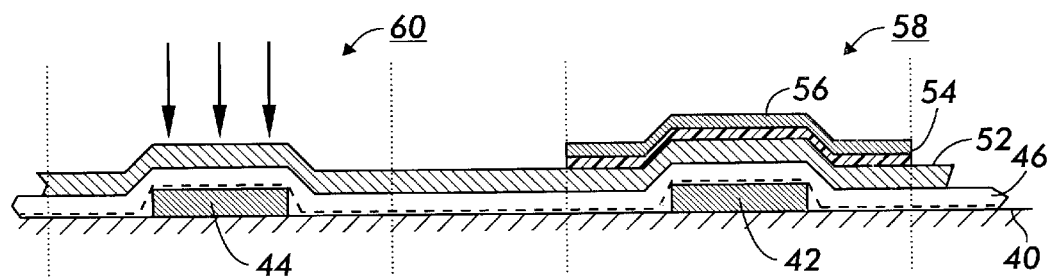
FIG. 5 is a cross-sectional view of two devices being formed on a shared substrate at still another intermediate stage in the process of forming same.

At step 24, a region of a-Si:H layer 52 in region 60 will be crystallized to form the channel of the poly-Si TFT. This crystallization is accomplished by directing laser light into the region to be crystallized. One technique for accomplishing this laser crystallization is described in detail in U.S. Pat. No. 5,366,926, which is incorporated herein by reference. Typically, a pulsed ultra violet (UV) excimer laser with gaussian output is used, with a pulse width on the order of 10 nsec. The laser beam is directed toward a beam homoginizer creating a square profiled beam. At this point in the process, the structure shown in FIG. 5 is retained on an x-y stepper within a vacuum chamber. The laser beam is directed through a window in the vacuum chamber so as to be incident upon the desired region of layer 52. The x-y stepper moves the substrate as required to cause the laser beam to sweep over the structure to form any additional devices to be formed on substrate 40. Importantly, masking layer 56 which is patterned so as to be located only in region 58, will protect the a-Si:H layer 52 thereunder from the laser crystallization process. This will allow the formation of the a-Si TFT in region 58.

A first pulse of the laser beam on the upper surface of layer 52 has an energy on the order of about 150 mJ/cm$^2$. Following this first pulse, the x-y stepper moves the structure a small amount. A second pulse of about 150 mJ/cm$^2$ is applied to the upper surface of layer 52. By a small amount, it is meant that the structure is moved such that the surface area of layer 52 irradiated by the second pulse overlaps the surface area of layer 52 irradiated by the first pulse by about 95%. The process is continued as required to irradiate at least all of the layer 52 within region 60. This process is then repeated again over layer 52 at a laser beam pulse energy of about 300 mJ/cm$^2$. A final pass over the structure with a laser beam pulse energy of at least about 350 mJ/cm$^2$ or greater produces a polycrystalline region 64 of layer 52. The average grain size in region 64 exceeds 1000 nm in the lateral direction.

As will be apparent to one skilled in the art, other laser crystallization techniques and apparatus may be employed without departing from the spirit and scope of the present invention.

Due to the proximity of regions 58 and 60, which may be on the order of between 2 and 50 μm from edge to edge, masking layer 56 is required to fully isolate that part of layer 52 in region 58 from any laser energy. Layer 52 is thereby effectively divided into two regions. Region 62 is composed of a-Si:H basically as-deposited. Region 64 is poly-Si (or crystallized a-Si).

As mentioned, the purpose for layer 56 is to act as a mask during the laser crystallization process. At this point in the process, the laser crystallization has been performed, and thus layer 56 may be fully removed from the structure. While not strictly required, its removal is preferred, and removal is shown at step 26 of FIG. 1.

One consequence of the laser crystallization process is the hydrogen in layer 52 is driven off in the crystallized regions. Rehydrogenation is required to passivate the induced defects in the crystallized region to obtain optimal device performance from the poly-Si TFT. This rehyrdogenation is shown at step 28 of FIG. 1. Rehydrogenation may be accomplished, for example, by placing the structure in a hydrogen plasma, and heating to about 250° C. for about 20 minutes. Other rehydrogenation techniques may also be employed.

Figure 6:
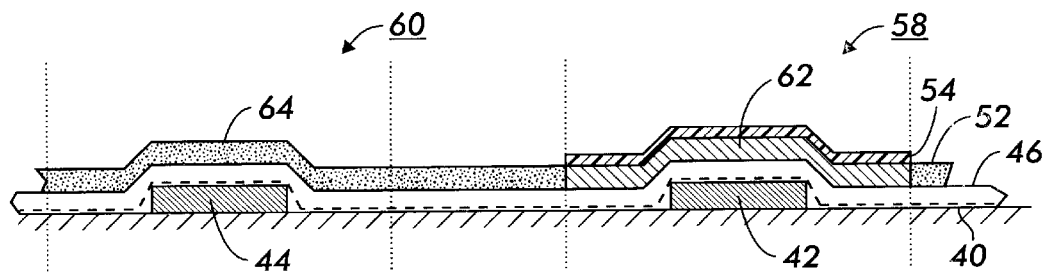
FIG. 6 is a cross-sectional view of two devices being formed on a shared substrate at yet another intermediate stage in the process of forming same.

The hydrogen plasma employed to rehydrogenate the crystallized regions of layer 52 will etch exposed a-Si. Thus, it is important that region 62 of layer 52 be protected from the rehydrogenating plasma. Layer 54, having been appropriately patterned with masking layer 56, is thus used as a mask to protect region 62 from fat etching by the plasma. The resulting structure is shown in FIG. 6.

Following the rehydrogenation process, at step 30, a dielectric layer 66 is deposited over at least a part of the structure at step 32. Dielectric layer 66 is deposited at least over, and thus in physical contact with crystallized region 64 of layer 52. Accordingly, dielectric layer 66 is preferably an oxide material such as SiO$_2$ to maintain a low threshold for the poly-Si device to be forrmed in region 60. The oxide layer may be deposited by plasma enhanced chemical vapor deposition (PECVD) at 250° C. The layer thickness is about 200 nm.

Figure 7:
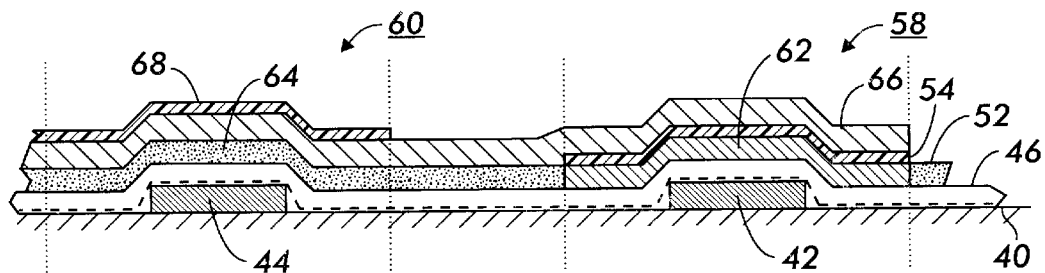
FIG. 7 is a cross-sectional view of two devices being formed on a shared substrate at a further intermediate stage in the process of forming same.

At step 32, an optional absorption layer 68 may be deposited over the structure and patterned and etched to leave the layer in region 60. Layer 68 will absorb some of the UV radiation used in the lithographic formation of the channel of the poly-Si TFT, as further described herein. Absorption layer 68 may be formed of one or more of many different materials which absorb UV radiation. To simplify the manufacturing process, layer 68 may be formed of a-Si. However, other materials from which layer 68 may be formed include Ge, SiGe, SiC, etc. The structure at this point in the manufacturing process is shown in FIG. 7.

At step 34, backside lithography is performed to form the discrete channels of the a-Si TFT in region 58 and the poly-Si TFT in region 60. Initially, a layer of UV curable photoresist (not shown) is deposited over the structure. Substrate 40 is transparent to UV light, and likewise to a greater or lesser degree are all layers of the material deposited thus far, with the exception of gate metals 42 and 44 which are opaque to UV light. The UV light is directed from below through substrate 40, through the deposited layers, and impinges the photoresist, exposing it except where blocked by the gate metals 42 and 44. The photoresist is developed where it has been exposed to UV light. The patterned photoresist is used as a mask to etch absorption layer 68, dielectric layer 66, and dielectric layer 54. As an example, Shipley 1813 photoresist may be employed using back side exposure for approximately 60 seconds with a 200 watt ultra violet lamp. Shipley 320 developer may then be employed.

One consequence of the formation of poly-Si material in region 64, while leaving a-Si:H region 62 essentially as-deposited is that poly-Si is more transparent to UV light than a-Si:H. Thus, proper exposure time for the backside lithography of step 34 will differ for regions 58 and 60. Specifically, exposure time for region 58 will be longer than exposure time for region 60. On the one hand, should the exposure time proper for region 58 be employed, the photoresist in region 64 will absorb more UV light energy than the photoresist in region 62. The principle consequence of this is a narrower channel structure in region 60 due to refraction and over exposure. We have found that this effect can result in a reduction in channel width of as much as 2 μm, which is significant when the total channel length is 5–10 micrometers. On the other hand, should the exposure time proper for region 60 be employed, the photoresist in region 58 will be under exposed and the channel subsequently formed will be poorly defined.

Figure 8:
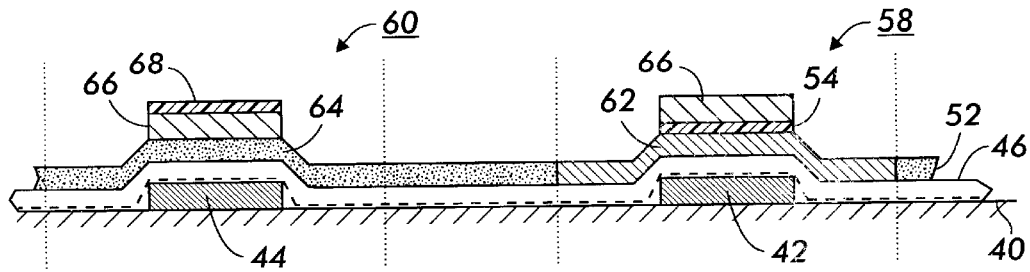
FIG. 8 is a cross-sectional view of two devices being formed on a shared substrate at a still further intermediate stage in the process of forming same.

To compensate for this difference in transparency between a-Si:H and poly-Si, absorption layer 68 may be employed above dielectric layer 66 and below the photoresist. As mentioned, layer 68 may be formed of one or more materials selected from a large list including Si, Ge, SiGe, SiC etc. Preferably, layer 68 will be formed of a-Si since that material is obviously compatible with the deposition processes employed. The extent of absorption of layer 68 will depend on both the layer's composition and its thickness. Target thickness for layer 68 consistent with the above-described embodiment is 50–100 nm. The structure at this point is substantially as shown in FIG. 8.

Figure 9:
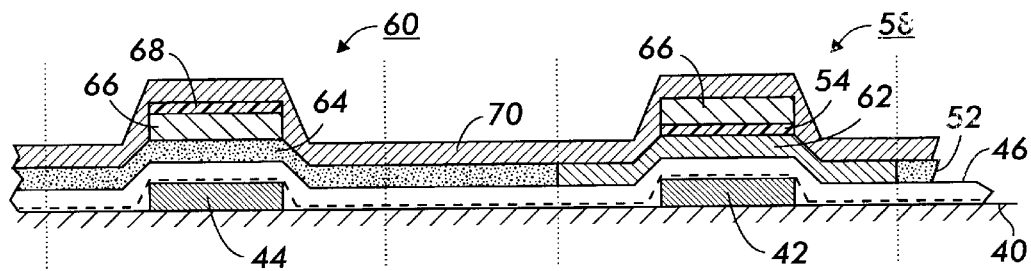
FIG. 9 is a cross-sectional view of two devices being formed on a shared substrate at a yet further intermediate stage in the process of forming same.

At step 36, a layer of a-Si:H 70 is deposited over the structure which shall form source and drain electrodes for the two TFTs. Layer 70 may be replaced by the direct doping of layers 62 and 64 in appropriate cases. In the latter case, one of many doping techniques may be employed, such as implantation, laser doping (for example as taught by U.S. patent application Ser. No. 08/927,023), etc. The structure at this point in the process is as shown in FIG. 9.

Figure 10:
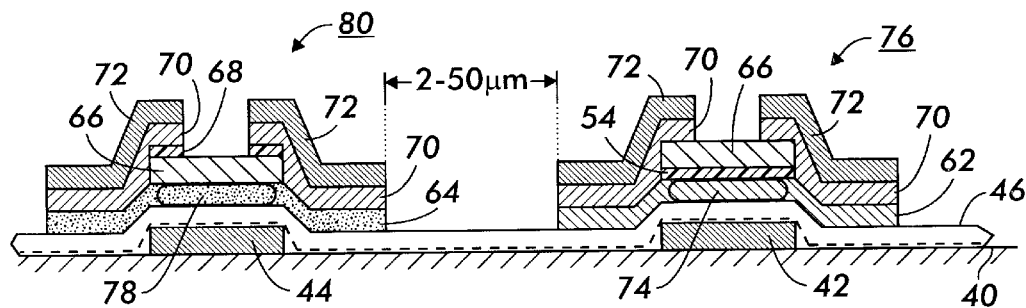
FIG. 10 is a cross-sectional view of two completed devices formed on a shared substrate according to one embodiment of the present invention.

At step 38, a conductive layer (not shown) of, for example, TiW/Al is deposited over a-Si layer 70 which shall form the contacts for the source and drain of the two TFTS. The conductive layer is etched by standard lithography and wet etching (or other similar process) to form source and drain contacts 72 a-Si layer 70, portions of layer 68, and portions of layer 52 are also etched by the above lithography and etching process. A discrete a-Si:H channel 74 is thus provided for a completed a-Si TFT 76, and a discrete poly-Si channel 78 is thus provided for a completed poly-Si TFT 76, as shown in FIG. 10. Proper contacts are made and a passivation layer (not shown) will ultimately be deposited over the structure to complete the device.

Described above has been a process and supporting structure for producing two adjacent TFFs, with an edge to edge spacing as small as between 2–50 μm, for example between 2 and 5 μm. Other characteristics typical of the structure used to form the two adjacent TFT include that the a first portion of the structure includes a first amorphous silicon layer, with a width greater than a first gate line 42, a second dielectric layer 66 with a width approximately matching the first gate line 42 and a third dielectric layer having a width approximately matching the second dielectric layer. A second portion of the structure used to form a second TFT includes a second gate line 44, a polycrystalline silicon layer 64 having a width greater than the width of the second gate line and an absorption layer having a width approximately matching the width of a second dielectric layer 66 deposited over gate line 44. An amorphous silicon layer 70 deposited over the polycrystalline silicon layer 64 has a width approximately matching the polycrystalline silicon layer. However the preceding dimensions are illustrative, and it will be appreciated that there are a number of variations apparent from the foregoing description.

Figure 11:
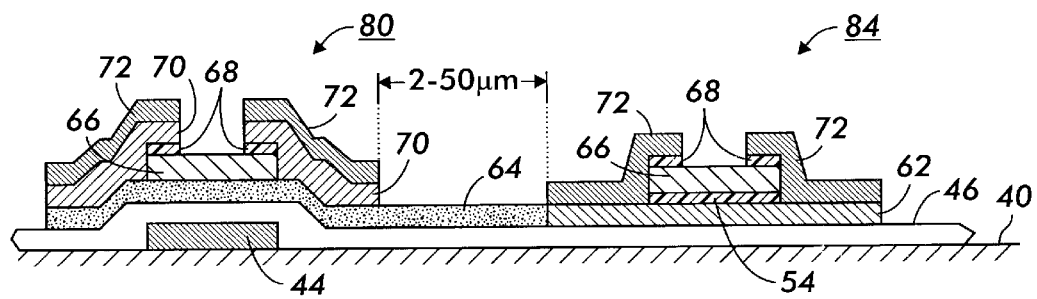
FIG. 11 is a cross-sectional view of an alternate embodiment of the present invention.

For example, in place of forming TFT 76, the above described process may be modified to produce other a-Si based devices such as a-Si resistor 84, shown in FIG. 11. The steps in process 10 are modified first by forming device 84 without a gate line 44. Instead, layer 52 is formed directly over and in contact with dielectric layer 46 in the region in which device 84 will be formed. Dielectric layers 54 and 66 are deposited as previously described. Absorption layer 68 may, in this case, be formed over dielectric layer 66, to absorb ultra violet radiation used in the back side lithography process. Contact layer 72 may next be deposited over and in contact with a-Si layer 52, without forming (or removing, if formed) the doped layer 70 from device 84.

A gap is formed dividing at least the contact layer 72 and absorption layer 68 into electrically isolated first and second regions, with a conduction path therebetween through a-Si layer 52. In this way, an a-Si resistor may be formed together with a poly-Si TFT on a shared substrate, with a spacing of between 2 and 50 micrometers. Advantageously, the a-Si provides high resistivity to the device. Of course, other a-Si devices may be similarly formed.

Figure 12:
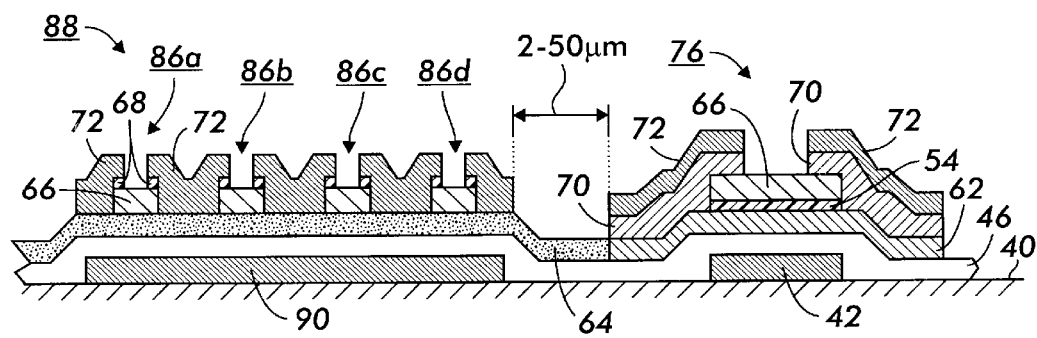
FIG. 12 is a cross-sectional view of a varactor formed on a shared substrate according to one embodiment of the present invention.

Likewise, devices other than a TFT may be formed of poly-Si on a shared substrate with an a-Si device. For example, shown in FIG. 12 is a varactor 88 formed on a shared substrate, and within 2 to 50 micrometers edge to edge of a-Si TFT 76. In this example, a-Si TFT 76 is formed as previously described. A plurality of stations 86a, 86b, 86c, 86d, etc. are formed over crystallized region 64 of layer 52. Each station consists of dielectric 66, absorption layer 68, and contact layer 72, formed over a single large contact line 90. Gaps separate contact layer 72 into first and second regions over each station, and the capacitance of the device may be selected by selectively contacting one or more of the separate stations. An advantage of this architecture is that a varactor with fast AC response time is obtained.

Finally, it will be apparent that while TFTs have been the focus of the above description, the present invention may be, or produce, devices sharing a common substrate, and formed with 2 to 50 micrometers of one another, where neither device is a TFT. Accordingly, the above descriptions should be read as illustrative only, and should not limit the scope of the claims except if and where otherwise indicated.

What is claimed is:

1. A structure for forming at least two devices on a shared substrate, comprising:

first and second contact regions over and in contact with the substrate;

a first dielectric layer over and in contact with said first and second contact regions and the substrate;

a layer of conductive material having first and second regions, said first region having a first crystalline state, said first crystalline state being amorphous silicon, and being located over and in contact with said first contact region, said second region having a converted first crystalline state, said converted first crystalline state being polysilicon, and being located over and in contact with said second contact region;

a second dielectric layer over and in contact with said layer of conductive material; and a masking layer over and in contact with said second dielectric layer such that said masking layer overlays said first contact region but not said second contact region, said masking layer masking the first region of the layer of conductive material such that a process used to convert the first crystalline state of the layer of conductive material converts only the layer of conductive material in the second region thereof, leaving the first region of the layer of conductive material unconverted.

2. The structure of claim 1, wherein said conductive layer is comprised in at least substantial part of silicon.

3. The structure of claim 2, wherein said masking layer is comprised of TiW.

4. The structure of claim 1, further comprising a protection layer over said first region of said layer of conductive material of the type protecting said first region of said layer of conductive material from the introduction of hydrogen atoms during a hydrogenation process.

5. The structure of claim 4, wherein said second dielectric layer forms said protection layer.

6. The structure of claim 5, wherein said second dielectric layer is a nitride.

7. The structure of claim 6, wherein said second dielectric layer is SiN.

8. The structure of claim 1, further comprising a third dielectric layer over and in contact with said layer of conductive material.

9. The structure of claim 8, wherein said third dielectric layer is located over and in contact with the second region of the layer of conductive material but not over or in contact with the first region of the layer of conductive material.

10. The structure of claim 9, wherein the third dielectric layer is an oxide.

11. The structure of claim 10, wherein the third dielectric layer is $SiO_2$.

12. The structure of claim 8, further comprising an absorption layer located over a portion of said second region of the layer of conductive material and in contact with the third dielectric layer, the absorption layer of the type absorptive of ultra violet radiation used in a back lithographic process for forming islands from one or more of the second and third dielectric layers over said first and second regions of the layer of conductive material.

13. The structure of claim 12, wherein the thickness of said absorption layer is selected to compensate for any difference in the transmission of ultraviolet radiation between the first and second regions of the layer of conductive material.

14. The structure of claim 12, wherein said absorption layer is comprised of material having said first crystalline state.

15. The structure of claim 14, wherein said absorption material is amorphous silicon.

16. A structure including a plurality of devices on a shared substrate, comprising:

a first device, said first device being a thin film transistor; comprising:

a first gate line over and in contact with said substrate, said first gate line having a desired width;

a first dielectric layer over and in contact with said first gate line and the substrate;

a first amorphous silicon layer over and in contact with said first dielectric layer, said first amorphous silicon layer having a width greater than the width of said first gate line;

a second dielectric layer located over and in contact with said first amorphous silicon layer, said second dielectric layer having a width approximately equal to the width of said first gate line, said second dielectric layer being a nitride;

a third dielectric layer located over and in contact with said second dielectric layer, said third dielectric layer having a width approximately equal to the width of said second dielectric layer, said third dielectric layer being an oxide;

a second amorphous silicon layer disposed over and in contact with said first amorphous silicon layer and said third dielectric layer, said second amorphous silicon layer further in contact with said second dielectric layer, said second amorphous silicon layer having a width approximately equal to the width of the first amorphous silicon layer;

an electrical contact layer located over and in contact with said second dielectric layer, said electrical contact layer having a width approximately equal to the width of said second amorphous silicon layer; and a gap defined by said second amorphous silicon layer and said electrical contact layer such that a second conductive layer and said electrical contact layer are separated by said gap into first and second regions thereof, each first and second region being electrically isolated from one another in the absence of an applied voltage; and a second device, said second device being a thin film transistor, comprising a second gate line over and in contact with said substrate, said second gate line having a desired width;

a first dielectric layer over and in contact with said second gate line and the substrate;

a polycrystalline silicon layer over and in contact with said first dielectric layer, said polycrystalline silicon layer having a width greater than the width of the second gate line;

a second dielectric layer located over and in contact with said polycrystalline silicon layer, said second dielectric layer having a width approximately equal to the width of the second gate line, said second dielectric layer being an oxide;

an absorption layer located over and in contact with said second dielectric layer, said absorption layer having a width approximately equal to the width of the second dielectric layer, said absorption layer being amorphous silicon;

an amorphous silicon layer disposed over and in contact with said polycrystalline silicon layer and said absorption layer, and further in contact with said second dielectric layer, said amorphous silicon layer having a width approximately equal to the width of the polycrystalline layer;

an electrical contact layer located over and in contact with said amorphous silicon layer; and a gap defined by said absorption layer, said amorphous silicon layer, and said electrical contact layer such that said absorption layer, said amorphous silicon layer, and said electrical contact layer are separated by said gap into first and second regions thereof, each first and second region being electrically isolated from one another in the absence of an applied voltage;

said first device having an edge adjacent said second device and said second device having an edge adjacent said first device, the distance between said edges being between 2 and 50 micrometers.

17. The device of claim 16, wherein the distance between said edge of said first device adjacent said second device and said edge of said second device adjacent said first device being between 2 and 5 micrometers.

* * * * *